United States Patent [19]

Wilson et al.

[11] Patent Number: 5,072,193

[45] Date of Patent: Dec. 10, 1991

[54] WIRE SHIELDING FOR RF CIRCUIT BOARDS AND AMPLIFIERS

[75] Inventors: Lance G. Wilson, N. Hollywood, Calif.; William J. Miller, Tempe, Ariz.

[73] Assignee: Motorola, Inc., Schaumburg, Ill.

[21] Appl. No.: 591,183

[22] Filed: Oct. 1, 1990

[51] Int. Cl.[5] .............................................. H03F 1/00
[52] U.S. Cl. ........................................ 330/66; 330/68
[58] Field of Search ............... 330/66, 67, 68; 357/74; 428/901

[56] References Cited

U.S. PATENT DOCUMENTS 3,368,150  2/1968  Worcester ............................. 330/68

Primary Examiner—Steven Mottola
Attorney, Agent, or Firm—Joe E. Barbee; Robert M. Handy

[57] ABSTRACT

The ease of manufacture and performance of printed circuit board RF amplifier and other electronic apparatus requiring a high degree of internal shielding is improved by distributing DC or other signals through rigid conduits having at least one flat side and containing the desired power or signal wires. The rigid conduit is typically soldered, flat side down, at multiple locations to an AC ground plane. The wires exit the conduit through side exit holes and end holes. Side holes are desirably provided at regular intervals. The flat side prevents or reduces rolling or other misalignment of the conduit during assembly, thereby easing circuit board construction. Conduits with square cross-sections are preferred.

15 Claims, 2 Drawing Sheets

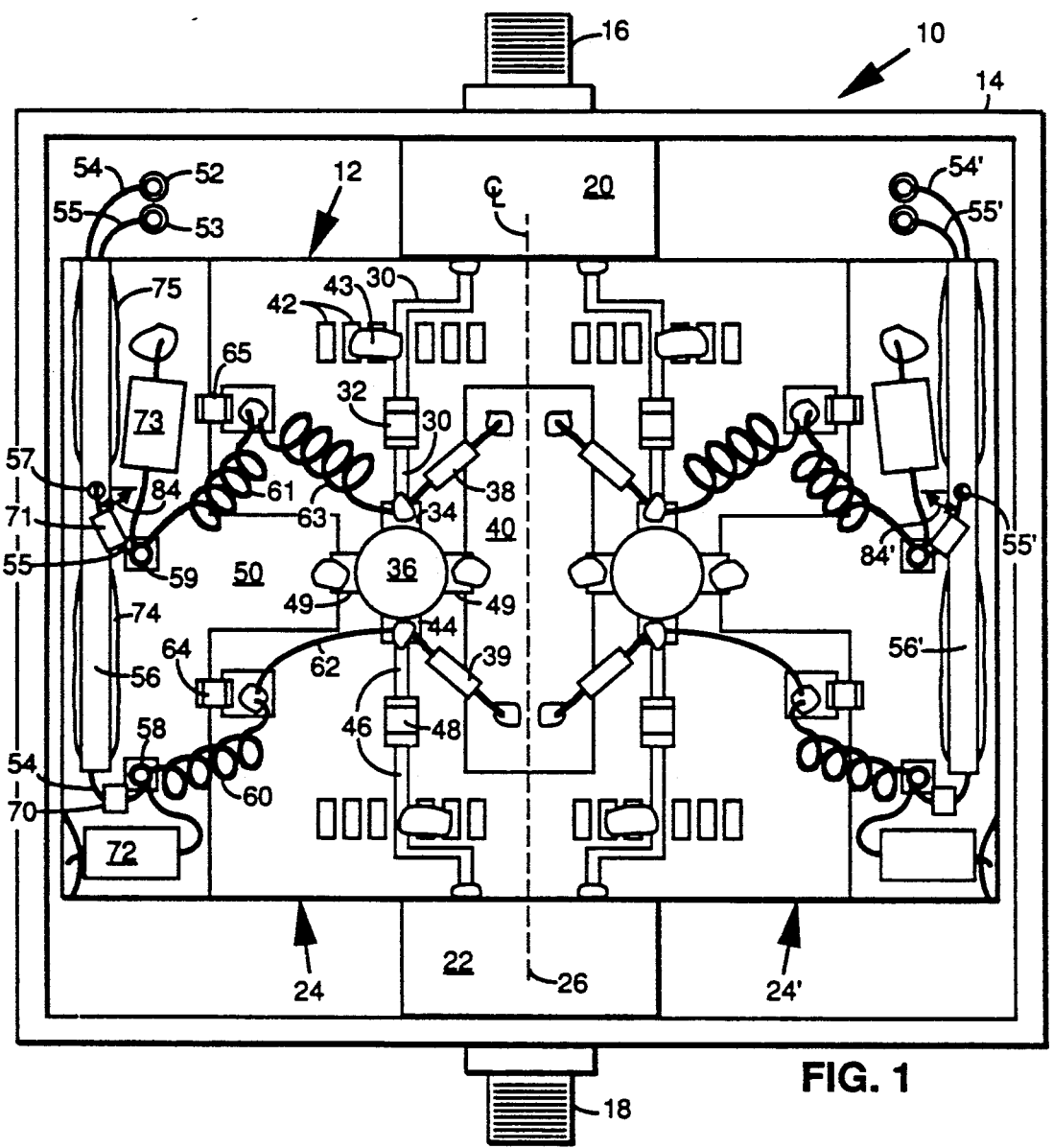
FIG. 1
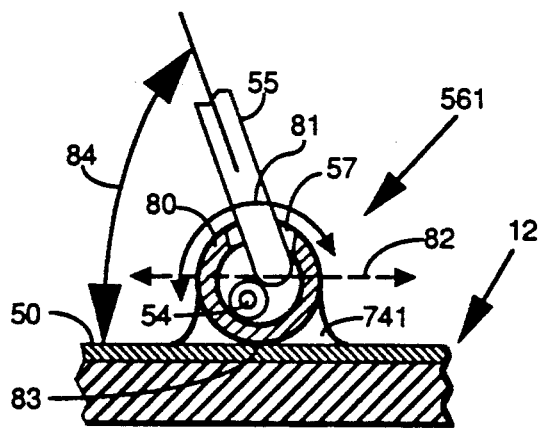
FIG. 2 - PRIOR ART
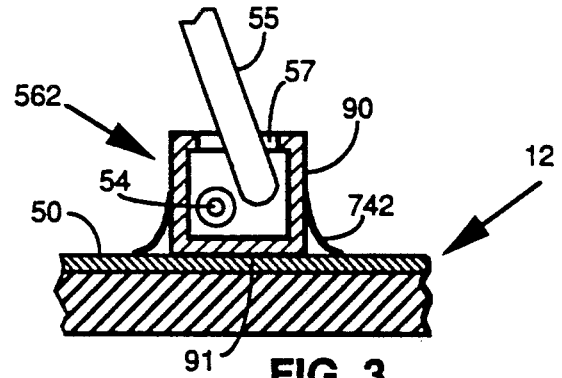
FIG. 3

WIRE SHIELDING FOR RF CIRCUIT BOARDS AND AMPLIFIERS

FIELD OF THE INVENTION

This invention concerns improved means and methods for shielding of wires on circuit boards, particularly circuit boards for RF amplifiers and other high frequency apparatus having very stringent internal shielding requirements.

BACKGROUND OF THE INVENTION

RF amplifiers and other high frequency electronic apparatus, are typically constructed today by combining various solid state amplifying devices, e.g., transistors, with other passive and active components on a circuit board. The circuit board is generally an insulating substrate on which are formed various flat metallic traces which serve to interconnect the various components on the board and deliver input signals, output signals, power and ground. Such circuit boards are typically formed by (1) bonding or depositing continuous metal foils on an insulating fiberglass or ceramic substrate and then etching the foil into the desired metal traces or (2) printing conductive inks in the shape of the desired metal traces directly onto the insulating substrate and then heating to release the organic binders and solvents. Such circuit boards are referred to in the art as "printed circuit boards" or by the abbreviation "PC boards". The components are typically attached to the metal traces by soldering although other means well known in the art can also be used.

A problem common to most RF amplifiers and other high frequency apparatus is control of internal signal radiation which can cause feedback and cross-talk from one part of the circuit to another. This is especially true in circuits which must handle substantial amounts of RF power. Such amplifiers and apparatus usually have very stringent internal shielding requirements.

It has been common in the art for many years to use shielded cables to reduce cross-talk and spurious signal coupling. Shielded cables typically comprise a round outer metallic covering (i.e., the shield) surrounding one or more internal wires. The shield may be flexible, e.g., formed from a copper braid, or rigid, e.g., formed from a round copper tube. The internal wires may be embedded in a plastic matrix which fills the shield so that their position within the shield is fixed or they may be loose. Another approach to shielding has been to provide a metal frame or chassis around and/or beneath the circuit board and have channels formed in the metal frame or chassis through which the wires desired to be shielded are routed.

These prior art approaches suffer from a number of disadvantages well known in the art. For example, flexible, braided shield conductors are difficult to position precisely and retain in predetermined locations in the RF assembly. Movement of the shielded cable can adversely affect the circuit performance. While this problem is partially overcome by using shielded cables with rigid shields, prior art versions have used round tubular shields which are difficult to control in manufacturing because of their propensity to roll or move during assembly.

Routing of the wires to be shielded through channels provided in the amplifier frame or enclosure avoids the problems associated with free-standing shielded cables, but channels are comparatively much more expensive to manufacture. Thus, there is an ongoing need for further improvement in the means and methods used for providing shielded wires or cables in RF and other high frequency apparatus where internal signal leakage and wire placement must be controlled to a very high degree.

As used herein, the words "radio frequency" and the abbreviation "RF", and the words "high frequency", are intended to refer to frequencies about $\geq 10^6$ cps, typically about $10^8$ to $10^{10}$ cps, and the abbreviation "DC" is intended to refer to substantially direct current and the abbreviation "AC" is intended to refer to alternative current.

SUMMARY OF THE INVENTION

It is an object of the present invention to provide an improved means and method for shielded cables and wires in RF amplifiers and other high frequency apparatus in which internal signal leakage or coupling and wire placement must be well controlled. It is a further objective to provide this in a manner which is more convenient and easy to use during manufacture of such electronic equipment, and which is resistant to movement or distortion due to acceleration or other forces acting on the finished equipment.

These and other objects and advantages are provided by an RF apparatus comprising, an insulating circuit board having multiple metal traces thereon for DC power, ground and AC signals, at least one active semiconductor component coupled to the metal traces, and at least one hollow tubular rigid metallic conduit with a flat portion attached to a ground metal trace at multiple locations along the length of the conduit and having at least one wire therein for providing DC power to the at least one amplifying component. The flat portion desirably extends substantially along the entire length of the conduit and the conduit is desirably attached to an AC ground at multiple locations along its length. It is further desirable that the conduit have multiple regularly spaced holes through which one or more wires exit the conduit.

It is still further desirable that the conduit has a polygonal cross-sectional shape, conveniently a substantially rectangular cross-sectional shape, and preferably a substantially square cross-sectional shape. This prevents rolling and reduces other motion during assembly. The conduit may be straight or bent into various shapes for convenience or wire routing.

In a typical application the conduit contains at least one wire extending the entire length of the conduit and another wire exiting through a hole at an intermediate position along the conduit. In applications where electrical symmetry is desired, two or more conduits arranged in mirror symmetry about a centerline of the PC board are provided.

BRIEF DESCRIPTION OF THE DRAWINGS

FIG. 1 is a top view of a typical RF power amplifier illustrating the problem of the present invention;

FIG. 2 is a cross-sectional view of a rigid conduit of the prior art;

FIG. 3 is a cross-sectional view of a rigid conduit according to a first embodiment of the present invention;

DETAILED DESCRIPTION OF THE DRAWINGS

Figure 4:
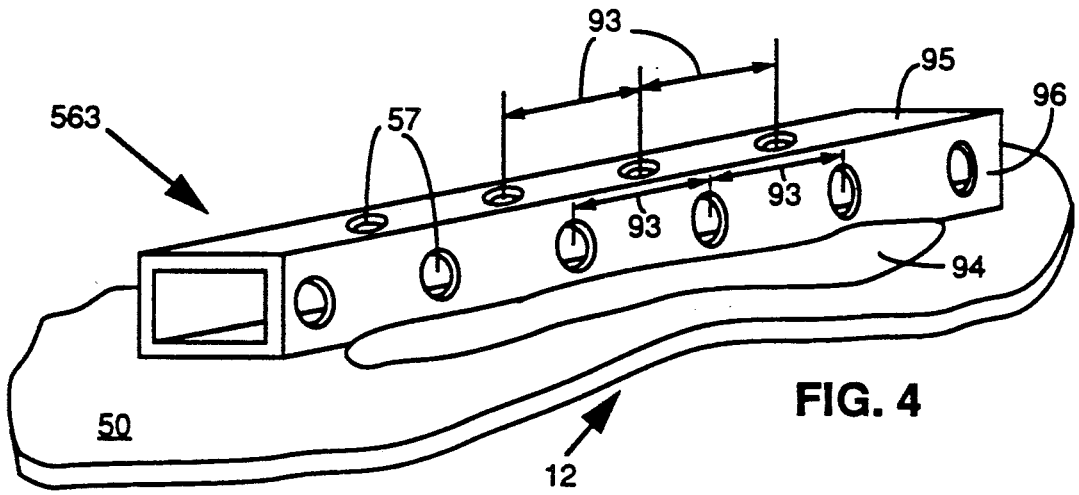
FIG. 4 is a perspective view of an alternate embodiment of a rigid conduit of the present invention.

FIG. 1 is a plan view, highly simplified, of dual RF amplifier 10 built on PC board 12 mounted in metal housing 4 (e.g., a machined aluminum block), and with input RF connector 16 and output RF connector 18. The metal lid (not shown) which would normally cover amplifier 10 has been removed to permit the internal construction of RF amplifier PC board 12 to be visible.

Input 16 is connected to amplifier PC board 12 by coupling network 20 and output 18 is connected to amplifier PC board 12 by coupling network 22. The exact nature of coupling networks 20, 22 will depend on whether amplifier 10 is a push-pull amplifier, a parallel amplifier, a quadrature amplifier or some other type of RF apparatus. Different types of RF amplifiers and coupling networks are well known in the art, and the exact choice thereof is outside the scope of the present invention.

In the example shown in FIG. 1, amplifier 10 and PC board 12 comprise two substantially identical RF sections 24, 24' on PC board 12 arranged with substantially mirror symmetry about PC board centerline 26. FIG. 1 is not intended to show all of the components that may be used in such an RF amplifier, but merely illustrate such an amplifier in sufficient detail that the nature of the problem and the solution thereto provided by the present invention may be understood.

Further, those of skill in the art will understand that the description of amplifier 10 and PC board 12 that follows is highly simplified and that other components and other arrangements may be used. In addition, those of skill in the art will understand that, although the present invention is described in terms of an RF amplifier, the particular electrical function being performed by the apparatus is not important, and the principles of the invention are applicable to any electrical apparatus where suppression of internal cross-talk and interstage coupling and stabilization of the location of certain power and signal lines, is important.

PC Board 12 has thereon metal signal trace or region 30 connecting input coupler 20 through chip capacitor 32 to input lead 34 of amplifying transistor 36. Variable capacitor 38 extends between input lead 34 and first ground trace or region 40. Additional metal traces or regions 42 are provided which are connected to input signal trace 30 by solder 43 for the purposes of varying the capacity between input trace 30 and the ground plane (not shown) on the reverse side of PC board 12, underlying all or nearly all the components. The use of such back-side ground planes is well understood in the art.

Amplifying transistor output terminal 44 is similarly connected via output metal trace or region 46 and capacitor 48 to output coupler 22 and output connector 18. Variable capacitor 39 may be provided between transistor output terminal 44 and first ground region or trace 40. Reference terminals 49 of transistor 36 are connected to first ground region 40 and second ground region 50. Ground regions or traces 40, 50 are generally tied together by connections extending through PC board 12 to the underlying ground plane on the rear face (not shown) of PC board 12.

DC power is supplied to amplifier 10 from DC power input pins 52, 53. In this instance, two different levels of DC are supplied, respectively, to pins 52, 53, to provide different bias levels in different parts of the circuit. A first DC voltage and current is coupled from first DC input pin 52 via lead 54 passing through rigid metal conduit 56 to insulated connection point 58, from whence it is coupled via an LC network provided by inductors 60, 62 and capacitor 64 to output terminal 44 of amplifying transistor 36.

Similarly, a second DC voltage and current is coupled from second DC input pin 53 via wire 55 passing through rigid metal conduit 56 and out hole 57 to insulated connection point 59, from whence it is coupled via an LC network comprising inductors 61, 63 and capacitor 65 to input terminal 34 of amplifying transistor 36. Ferrite cores 70, 71 are generally provided on wires 54, 55, and capacitors 72, 73 are provided between connection points 58, 59 and ground region 50 to suppress transients and out of band lower frequency instabilities, as for example, to suppress oscillations in the $2-20 \times 10^6$ cps range in an amplifier intended to operate in the $3-10 \times 10^8$ cps range. A similar arrangement of components is found across centerline 26 on side 24' of board 12, and the same reference numbers with primes are intended to identify the corresponding components thereon.

Metal conduit 56 is electrically connected, as for example by solder region 74, 75, to ground region 50 on PC board 12. It is desirable that conduit 56 be attached to ground region 50 at multiple locations spaced along the length of conduit 56, and preferable substantially along its entire length, so as to provide to lowest impedance to ground.

For a quadrature RF amplifier delivering about 25 watts at $8-10 \times 10^8$ cps, PC board 12 is about 11.5 cm long (i.e., parallel to centerline 26) and about 9.5 cm wide, and is fabricated from a conventional 0.7 mm thick Teflon ™ impregnated fiberglass board with 25 micrometer thick etched copper traces thereon. A type MRA-1000-14L RF transistor manufactured by Motorola, Inc., Phoenix, Ariz. is an example of a suitable amplifying transistor 36. Capacitors, resistors and inductors are conventional. DC inputs 52, 53, supply 24 volts and 0.75 volts respectively, referenced to ground. Soldering is the preferred means of attaching components and wires to the various signal and ground traces or regions.

FIGS. 2-3 are simplified cross-sections of conduit 56 in the vicinity of opening 57 looking along the axis of conduit 56 and showing wire 55 exiting hole 57 and wire 54 continuing through conduit 56. FIG. 2 illustrates how conduit 56 was constructed in the prior art and FIG. 3 illustrates the construction of conduit 56 according to the present invention.

In prior art FIG. 2, conduit 561, analogous to conduit 56 of FIG. 1, has a round cross-section 80. A difficulty with round cross-section 80 is that when round conduit 561 and associated wires are being attached to PC board 12, in particular when conduit 561 with round cross-section 80 is being soldered to ground region 50, it has a tendency to rotate and/or slide as shown by arrows 81–82. There is only limited contact 83 between round cross-section 80 and metal region 50 and a smaller solder region 741 (analogous to solder region 74). Thus, round conduit 561 is relatively easily moved during assembly. This makes it difficult to control with great precision, the location and angle made by wires 55, 54 which pass through and exit from conduit 561.

For example, if conduits 56, 56' on symmetric portions 24, 24' of PC board 12 have round cross-sections as in conduit 561, and rotate in the same direction during assembly, when for example board 12 is tilted slightly or there is uneven tension on wires 54, 54', 55, 55' while solder 741 is still liquid, then exit angle 84 of wire 55 on portion 24 of PC board 12 will move in one direction (e.g., increase) while corresponding exit angle 84' of wire 55' on portion 24' of PC board 12 will move in the opposite direction (e.g., decrease). Under these circumstances, the two portions 24, 24' of amplifier 10 will be not be perfectly mirror symmetric about centerline 26, and undesirable internal amplifier imbalance may be created. This can create undesirable coupling which degrades amplifier performance, sometime resulting in unintended oscillation. RF amplifiers and other high frequency apparatus, particularly those operating at high power levels, are especially susceptible to such layout induced imbalance. In addition, rotation or displacement of conduits 56, 56' during assembly may also cause wires exiting therefrom to interfere mechanically or electrically with other components or with housing 14.

This problem is overcome with the arrangement of FIG. 3 in which improved conduit 562, corresponding to conduits 56, 56' has cross-section 90 which is flat on side 91 intended to contact ground region 50 of board 12. This arrangement has two advantages which make it easier to use for RF amplifiers or other high frequency apparatus to provide improved symmetry and lead positioning, (i) the flat-bottomed shape of improved conduit 562 provides a large area contact with ground region 50, thereby increasing the friction and surface tension between flat bottomed cross-section 90 and ground region 50 when being attached by solder 742 and reducing the tendency for conduit 562 to slide around during assembly, and (ii) the flat-bottomed shape of improved conduit 562 eliminates any tendency for conduit 56 to rotate during assembly. It is substantially easier with flat-bottomed conduit 562 to assemble RF amplifiers and other high frequency apparatus requiring careful positioning and shielding of power or other leads, and especially those requiring careful electrical balancing of symmetrical sections.

FIG. 3 illustrates a convenient embodiment in which conduit 562 has a rectangular cross-section, preferably square. FIG. 4 also shows a similar conduit 563, attached to ground region 50 of board 12 by substantially continuous solder region 94, and with side holes 57 spaced at regular intervals 93 along the length of conduit 563. Side holes 57 may be in upper surface 95 or in upright surface 96. The regularly spaced holes provide the advantage that the conduit may be mass produced to a standard specification and then merely cut to the appropriate overall length for a particular amplifier and the wire fed out the side hole closest to the intended location, rather than having to drill or machine the holes separately for each particular amplifier. This is a great manufacturing convenience.

Figure 5:
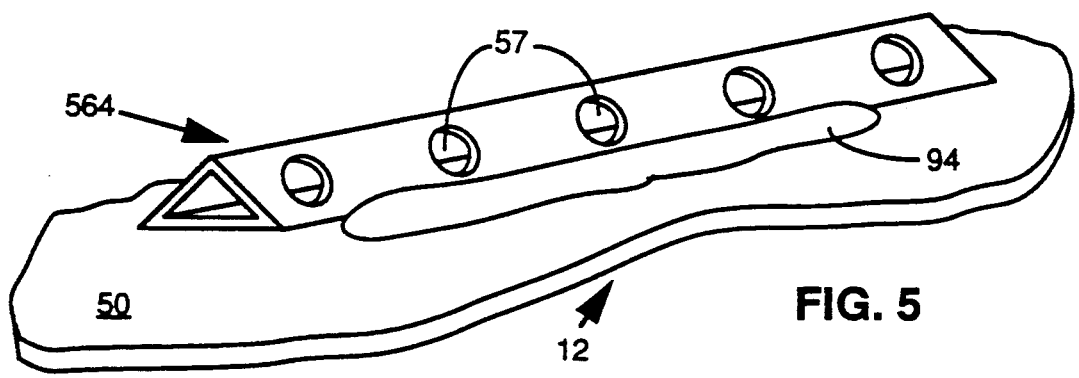
FIG. 5 is a perspective view of yet another embodiment of the rigid conduit of the present invention.
Figure 6:
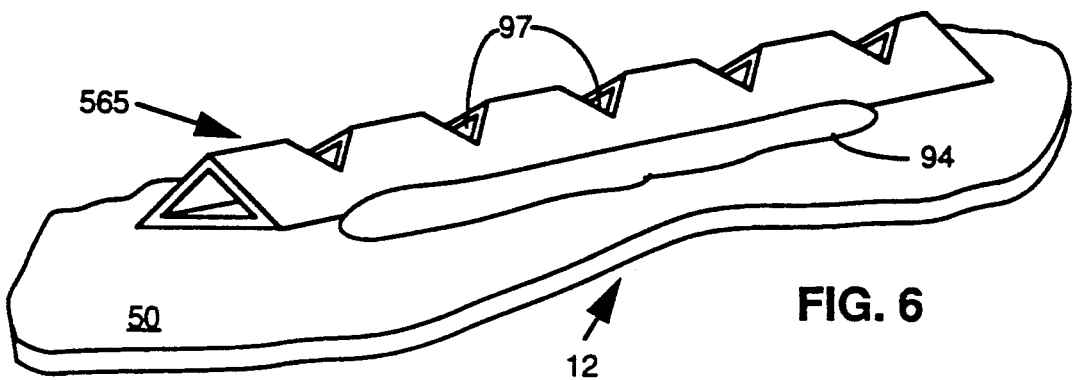
FIG. 6 is a perspective view of a further alternate embodiment of the rigid conduit of the present invention.

FIG. 5 illustrates conduit 564 of triangular cross-section, also with periodic circular holes 57. FIG. 6 illustrates a still further embodiment of conduit 565 in which holes 94 are provided by machining rather than drilling. Those of skill in the art will understand based on the description herein that the improved conduit of the present invention may have any cross-section so long as it has a flat bottom for mating with the flat metal trace on the intended PC board. Any cross-sectional shape with a flat region is suitable, as for example, a circle or oval with a flat portion and/or any polygon. Rectangular cross-sections are convenient and square cross-sections are preferred.

Those of skill in the art will also understand based on the description herein that, while straight conduits have been illustrated, the present invention also applies to conduits that are curved or bent at various angles, provided that they have a flat lower side to provide a large area contact with the ground trace.

While the present invention has been described in terms of particular implementations and for certain types of electronic apparatus, many variations are possible without departing from the scope of the present invention. Accordingly, it is intended to include these and such other variations as will occur to those of skill in the art based on the teachings herein, in the claims that follow.

We claim:

1. An RF apparatus comprising:
   an insulating circuit board having multiple metal traces thereon for DC power, ground and RF signals;
   at least one active semiconductor component coupled to the metal traces;
   at least one hollow tubular rigid metallic conduit with a flat bottom resting directly on the insulating circuit board and attached to a metal trace at multiple locations along the length of the conduit and having at least one wire therein exiting the conduit for providing DC power to the at least one active semiconductor component.

2. An RF apparatus comprising:
   an insulating circuit board having multiple metal traces thereon for DC power, ground and RF signals;
   at least one active semiconductor component coupled to the metal traces;
   at least one hollow tubular rigid metallic conduit with a flat portion attached to a metal trace at multiple locations along the length of the conduit and having at least one wire therein exiting the conduit for providing DC power to the at least one active semiconductor component wherein the conduit comprises multiple regularly spaced side holes with at least one wire exiting the conduit via one side hole.

3. The amplifier of claim 1 wherein the conduit has a polygonal cross-sectional shape.

4. The amplifier of claim 3 wherein the conduit has a substantially rectangular cross-sectional shape.

5. The amplifier of claim 4 wherein the conduit has a substantially square cross-sectional shape.

6. An RF apparatus comprising:
   an insulating circuit board having multiple metal traces thereon for DC power, ground and RF signals;
   at least one active semiconductor component coupled to the metal traces;
   at least one hollow tubular rigid metallic conduit with a flat portion attached to a metal trace at multiple locations along the length of the conduit and having at least one wire therein exiting the conduit for providing DC power to the at least one active semiconductor component wherein the conduit contains at least one wire extending the entire length of the conduit and another wire exiting through a side hole at an intermediate position along the conduit.

7. The amplifier of claim 1 wherein the flat bottom extends substantially along the entire length of the conduit.

8. A balanced high frequency power amplifier comprising:
an insulating circuit board containing at least ground and signal traces arranged substantially symmetrically about a longitudinal center line, for accommodating two symmetric amplifying means;
amplifying components coupled to the symmetrical signal traces;
at least two symmetrical DC power distribution means arranged substantially parallel to the longitudinal center line, wherein each of the DC distribution means comprises a metallic tube having a flattened portion conjunctively attached at multiple locations to the ground trace and carrying internally at least one DC power distribution wire which exits the tube through at least one predetermined hole location.

9. The amplifier of claim 8 wherein the at least one predetermined hole location comprises a hole in a side of the tube.

10. The amplifier of claim 9 wherein the at least one predetermined hole location further comprises an end of the tube.

11. The amplifier of claim 8 comprising multiple wire exit hole locations in a side of the tube.

12. The amplifier of claim 11 wherein the DC power distribution wire exits the tube through at least one of the multiple wire exit locations.

13. The amplifier of claim 8 wherein the tube is polygonal in cross-section.

14. The amplifier of claim 8 wherein the tube is rectangular in cross-section.

15. The amplifier of claim 8 wherein the tube is square in cross-section.

* * * * *